United States Patent
Bierhoff et al.

(10) Patent No.: US 8,309,921 B2
(45) Date of Patent: *Nov. 13, 2012

(54) COMPACT SCANNING ELECTRON MICROSCOPE

(75) Inventors: Martinus Petrus Maria Bierhoff, Deurne (NL); Bart Buijsse, Eindhoven (NL); Cornelis Sander Kooijman, Veldhoven (NL); Hugo Van Leeuwen, Eindhoven (NL); Hendrik Gezinus Tappel, Casteren (NL); Colin August Sanford, Atkinson, NH (US); Sander Richard Marie Stoks, Nijmegen (NL); Steven Berger, Newburyport, MA (US); Ben Jacobus Marie Bormans, Asten (NL); Koen Arnoldus Wilhelmus Driessen, Valkenswaard (NL); Johannes Antonius Hendricus W. G. Persoon, Waalre (NL)

(73) Assignee: FEI Company, Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/019,216

(22) Filed: Feb. 1, 2011

(65) Prior Publication Data
US 2011/0133083 A1    Jun. 9, 2011

Related U.S. Application Data

(63) Continuation of application No. 12/303,611, filed as application No. PCT/US2007/070655 on Jun. 7, 2007, now Pat. No. 7,906,762.

(60) Provisional application No. 60/811,621, filed on Jun. 7, 2006.

(51) Int. Cl.
*H01J 37/20* (2006.01)
*H01J 37/252* (2006.01)
*H01J 37/28* (2006.01)

(52) U.S. Cl. ............... 250/310; 250/306; 250/440.11; 250/441.11; 250/442.11

(58) Field of Classification Search ............ 250/306, 250/310, 440.11, 441.11, 442.11
See application file for complete search history.

(56) References Cited

U.S. PATENT DOCUMENTS

| 3,812,365 A | 5/1974 | LePoole |
| 3,981,546 A | 9/1976 | Sperman |

(Continued)

FOREIGN PATENT DOCUMENTS

DE    3332248    3/1985

(Continued)

OTHER PUBLICATIONS

Khursheed, A. et al., 'Miniature Scanning Electron Microscope Design based upon the use of Permanent Magnets,' SPIE, Jan. 1, 1997, pp. 175-184, vol. 3155.

(Continued)

*Primary Examiner* — David A Vanore
(74) *Attorney, Agent, or Firm* — Scheinberg & Associates, PC; Michael O. Scheinberg; Ki O

(57) ABSTRACT

A compact electron microscope uses a removable sample holder having walls that form a part of the vacuum region in which the sample resides. By using the removable sample holder to contain the vacuum, the volume of air requiring evacuation before imaging is greatly reduced and the microscope can be evacuated rapidly. In a preferred embodiment, a sliding vacuum seal allows the sample holder to be positioned under the electron column, and the sample holder is first passed under a vacuum buffer to remove air in the sample holder.

7 Claims, 14 Drawing Sheets

U.S. PATENT DOCUMENTS

| | | | |
|---|---|---|---|
| 4,080,526 A | 3/1978 | Kihara et al. | |
| 4,162,391 A | 7/1979 | Sciaky | |
| 4,165,881 A | 8/1979 | Salter | |
| 4,229,655 A | 10/1980 | Ryding | |
| 4,241,259 A | 12/1980 | Feuerbaum et al. | |
| 4,409,486 A | 10/1983 | Bates | |
| 4,516,026 A | 5/1985 | Jouffrey et al. | |
| 4,584,479 A | 4/1986 | Lamattina et al. | |
| 4,607,167 A * | 8/1986 | Petric | 250/492.2 |
| 4,639,597 A | 1/1987 | Shiokawa | |
| 4,705,949 A | 11/1987 | Grimes, II et al. | |
| 4,806,766 A | 2/1989 | Chisholm | |
| 4,818,838 A | 4/1989 | Young et al. | |
| 4,999,496 A | 3/1991 | Shaw et al. | |
| 5,103,102 A | 4/1992 | Economou et al. | |
| 5,254,856 A | 10/1993 | Matsui et al. | |
| 5,300,776 A | 4/1994 | Krivanek | |
| 5,396,067 A | 3/1995 | Suzuki et al. | |
| 5,399,860 A | 3/1995 | Miyoshi et al. | |
| 5,453,617 A | 9/1995 | Tsuneta et al. | |
| 5,591,970 A | 1/1997 | Komano et al. | |
| 5,869,833 A | 2/1999 | Richardson et al. | |
| 6,057,553 A | 5/2000 | Khursheed et al. | |
| 6,307,312 B1 | 10/2001 | Tanaka | |
| 6,320,194 B1 | 11/2001 | Khursheed et al. | |
| 6,421,122 B2 | 7/2002 | Nara et al. | |
| 6,515,287 B2 | 2/2003 | Notte, IV | |
| 6,515,288 B1 | 2/2003 | Ryding et al. | |
| 6,516,517 B2 | 2/2003 | Zywno | |
| 6,552,340 B1 | 4/2003 | Krivanek et al. | |
| 6,559,457 B1 | 5/2003 | Phan et al. | |
| 6,582,251 B1 | 6/2003 | Burke et al. | |
| 6,667,475 B1 * | 12/2003 | Parran et al. | 850/9 |
| 6,683,316 B2 | 1/2004 | Schamber et al. | |
| 6,710,354 B1 | 3/2004 | Koch et al. | |
| 6,768,114 B2 | 7/2004 | Takagi | |
| 6,816,238 B2 | 11/2004 | Bisschops et al. | |
| 6,831,278 B2 | 12/2004 | Yamamoto et al. | |
| 6,844,922 B2 | 1/2005 | Bisschops et al. | |
| 6,897,443 B2 * | 5/2005 | Gross | 850/9 |
| 6,936,817 B2 | 8/2005 | Feuerbaum | |
| 7,043,848 B2 | 5/2006 | Hollman et al. | |
| 7,060,990 B2 * | 6/2006 | Tanaka et al. | 250/442.11 |
| 7,064,325 B2 | 6/2006 | Buijsse et al. | |
| 7,067,820 B2 | 6/2006 | Buijsse | |
| 7,091,497 B2 | 8/2006 | Visscher | |
| 7,211,797 B2 | 5/2007 | Nishiyama et al. | |
| 7,220,963 B2 * | 5/2007 | Gross | 250/310 |
| 7,220,973 B2 * | 5/2007 | Yu et al. | 250/442.11 |
| 7,230,253 B2 * | 6/2007 | Ham | 250/442.11 |
| 7,285,785 B2 | 10/2007 | Buijsse et al. | |
| 7,294,833 B2 | 11/2007 | Konno et al. | |
| 7,301,157 B2 | 11/2007 | Buijsse et al. | |
| 7,325,715 B2 | 2/2008 | Costello | |
| 7,339,167 B2 | 3/2008 | Ohshima et al. | |
| 7,341,393 B2 | 3/2008 | Hosoda et al. | |
| 7,456,413 B2 | 11/2008 | Buijsse et al. | |
| 7,767,979 B2 | 8/2010 | Dona | |
| 7,906,762 B2 * | 3/2011 | Bierhoff et al. | 250/310 |
| 2002/0024012 A1 | 2/2002 | Abe et al. | |
| 2003/0042852 A1 | 3/2003 | Chen | |
| 2005/0035303 A1 * | 2/2005 | Ham | 250/442.11 |
| 2005/0236568 A1 | 10/2005 | Buijsse et al. | |
| 2006/0249917 A1 | 11/2006 | Kosty | |
| 2006/0284108 A1 * | 12/2006 | Buijsse et al. | 250/441.11 |
| 2008/0250881 A1 * | 10/2008 | Dona | 73/864.91 |
| 2009/0200489 A1 | 8/2009 | Tappel et al. | |
| 2009/0242763 A1 * | 10/2009 | Buijsse | 250/307 |
| 2010/0025578 A1 * | 2/2010 | Hill et al. | 250/307 |
| 2010/0171037 A1 | 7/2010 | Bierhoff et al. | |
| 2010/0194874 A1 * | 8/2010 | Bierhoff et al. | 348/80 |
| 2010/0230590 A1 * | 9/2010 | Bierhoff et al. | 250/310 |
| 2010/0276592 A1 * | 11/2010 | Persoon et al. | 250/310 |
| 2010/0294049 A1 * | 11/2010 | Kelley et al. | 73/864.83 |

FOREIGN PATENT DOCUMENTS

| | | |
|---|---|---|
| EP | 0969494 | 5/2000 |
| JP | 01296549 | 11/1989 |
| JP | 03194838 | 8/1991 |
| JP | 04363849 | 12/1992 |
| JP | H06-139984 | 5/1994 |
| JP | 2001-076661 | 3/2001 |
| JP | 2003346697 | 12/2003 |
| JP | 2004-031207 | 1/2004 |
| JP | 2004-253156 | 9/2004 |
| JP | 2004-327302 | 11/2004 |
| JP | 2005-147956 | 6/2005 |
| JP | 2005-149756 | 6/2005 |
| JP | 2005-203123 | 7/2005 |
| JP | 2005-243587 | 9/2005 |
| WO | 2004100206 | 11/2004 |
| WO | 2007008602 | 1/2007 |
| WO | 2007143734 | 12/2007 |
| WO | 2007143736 | 12/2007 |
| WO | 2007143737 | 12/2007 |
| WO | 2007145712 | 12/2007 |

OTHER PUBLICATIONS

Reimer, L., et al., 'Scanning Electron Microscope,' 1985, pp. 185-190.

Jackson, R.L. et al., "A Statistical Model of Elasto-Plastic Asperity Contact Between Rough Surfaces," Science Direct, Tribology International, 2006, pp. 906-914, vol. 39.

Kim, N.H. et al., "Finite Element Analysis and Experiments of Metal/Metal Wear in Oscillatory Contacts," Science Direct, Wear, 2005, pp. 1787-1793, vol. 258.

Cameron, R.E. et al., "Minimizing Sample Evaporation in the Environmental Scanning Electron Microscope," Journal of Microscopy, Mar. 1994, pp. 227-237, vol. 173, Part 3.

Norden, B.N., "On the Compression of a Cylinder in Contact with a Plane Surface," NBSIR 73-243, Final Report, Institute for Basic Standards, National Bureau of Standards, Jul. 19, 1973, 67 Pages, Washington (D.C.).

Toth, M. et al., "On the Role of Electron-Ion Recombination in Low Vacuum Scanning Electron Microscopy," Journal of Microscopy, Jan. 2002, pp. 86-95, vol. 205, Part 1.

Mathieu, C., "The Beam-Gas and Signal-Gas Interactions in the Variable Pressure Scanning Electron Microscope," Scanning Microscopy, 1999, pp. 23-41, vol. 13, No. 1.

Wanstrand, O.,"Wear Resistant Low Friction Coatings for Machine Elements," Dissertation, Acta Universitatis Upsaliensis, Uppsala 2000, 38 pages.

Japanese Office Action in JP App. No. 2009-514539, May 29, 2012, 5 pgs.

* cited by examiner

COMPACT SCANNING ELECTRON MICROSCOPE

The present application is a continuation of U.S. patent application Ser. No. 12/303,611, with a 371 filing date of Jan. 22, 2009, which claims priority from International Application PCT/US2007/070655, filed Jun. 7, 2007, and from U.S. Provisional Application 60/811,621, filed Jun. 7, 2006, which are hereby incorporated by reference.

TECHNICAL FIELD OF THE INVENTION

The present invention relates to electron microscopes.

BACKGROUND OF THE INVENTION

Electron microscopy provides significant advantages over optical microscopy, such as higher resolution and greater depth of focus. In a scanning electron microscope (SEM) a primary electron beam is focused to a fine spot that scans the surface to be observed. Secondary electrons are emitted from the surface as it is impacted by the primary beam and some electrons from the primary beam are backscattered. The secondary or backscattered electrons are detected and an image is formed, with the brightness at each point of the image being determined by the number of electrons detected when the beam impacts a corresponding spot on the surface.

Electron microscopes are typically large, complex, and expensive instruments that require skilled technicians to operate them. SEM devices typically cost well over $100,000 and require special facilities, including dedicated electrical wiring and venting of the vacuum pump outside of the operator area. Further, it can be difficult in a high magnification image such as that of an SEM for a user to determine where on the sample an image is being obtained and to understand the relationship between that image and the rest of the sample. The cost of electron microscopes and the sophistication required to operate them have limited their use to research and industry that can afford the cost and provide the expertise to operate.

Because air molecules interfere with a beam of electrons, the sample in an electron microscope is maintained in a vacuum. After a sample is inserted, it typically takes a relatively long period of time for air in the chamber to be evacuated, so that a user must wait before an image is available. This delay makes use of an SEM impractical in many applications.

It would be desirable to provide a low cost electron microscope that can be operated by users that are not highly skilled and that could produce an image quickly after a sample is inserted.

SUMMARY OF THE INVENTION

An object of the invention is to provide a scanning electron microscope that is inexpensive, easy to use, and can be of sufficiently small dimensions that it can be placed, for example, atop a classroom table.

An instrument of the present invention microscope uses a removable sample holder having walls that form a part of the vacuum region in which the sample resides. By eliminating the large sample chamber used in prior art instruments, the instrument can be rapidly evacuated and imaging or other processing can be commenced rapidly.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION OF PREFERRED EMBODIMENTS

Figure 1:
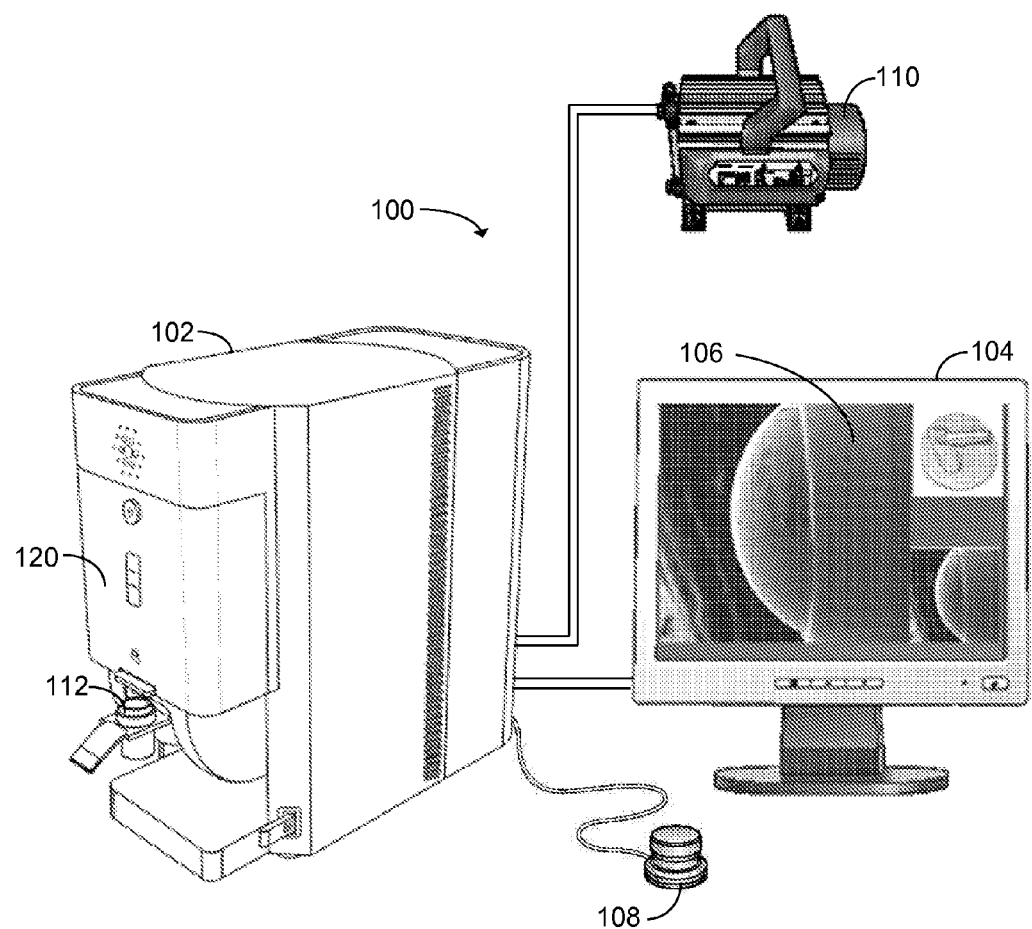
FIG. 1 shows the exterior of a preferred embodiment of an electron microscope system of the present invention.

FIG. 1 shows the exterior of a preferred embodiment of an electron microscope system 100 of the present invention that includes SEM assembly 102, a display monitor 104, preferably incorporating a touch screen 106 for accepting user input, an rotary user input device 108, and an external pre-vacuum pump 110, such as a diaphragm pump. A sample holder 112 holds the sample to be viewed and is inserted into SEM assembly 102.

Electron microscope system 100 require no special facilities installation, that is, a preferred embodiment can operate on conventional power, that is, by plugging into a wall socket, and the vacuum system does not require venting to outside of the operator area. SEM assembly 102 does not require special vibration damping mounting. SEM assembly 102 is literally a "table-top SEM," that can be set on any sturdy work surface and plugged into the wall. Electron microscope system 100 is therefore suitable for use in classroom or even in homes. Some embodiments can operate on direct current, such as from a 24 V power supply, making those embodiments truly portable.

Figure 2:
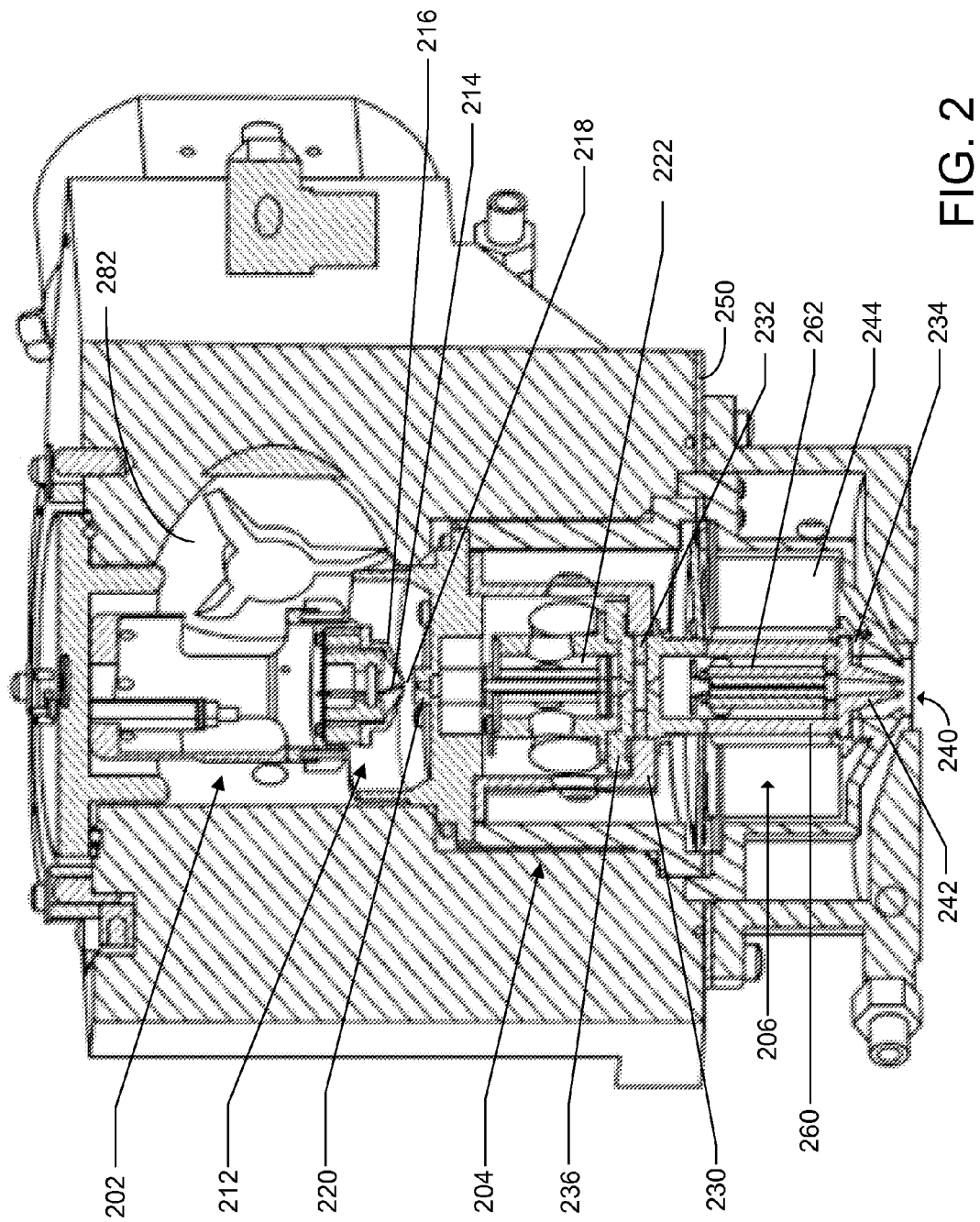
FIG. 2 shows a partial cross-sectional view of a portion of the electron microscope system of FIG. 1.
Figure 3:
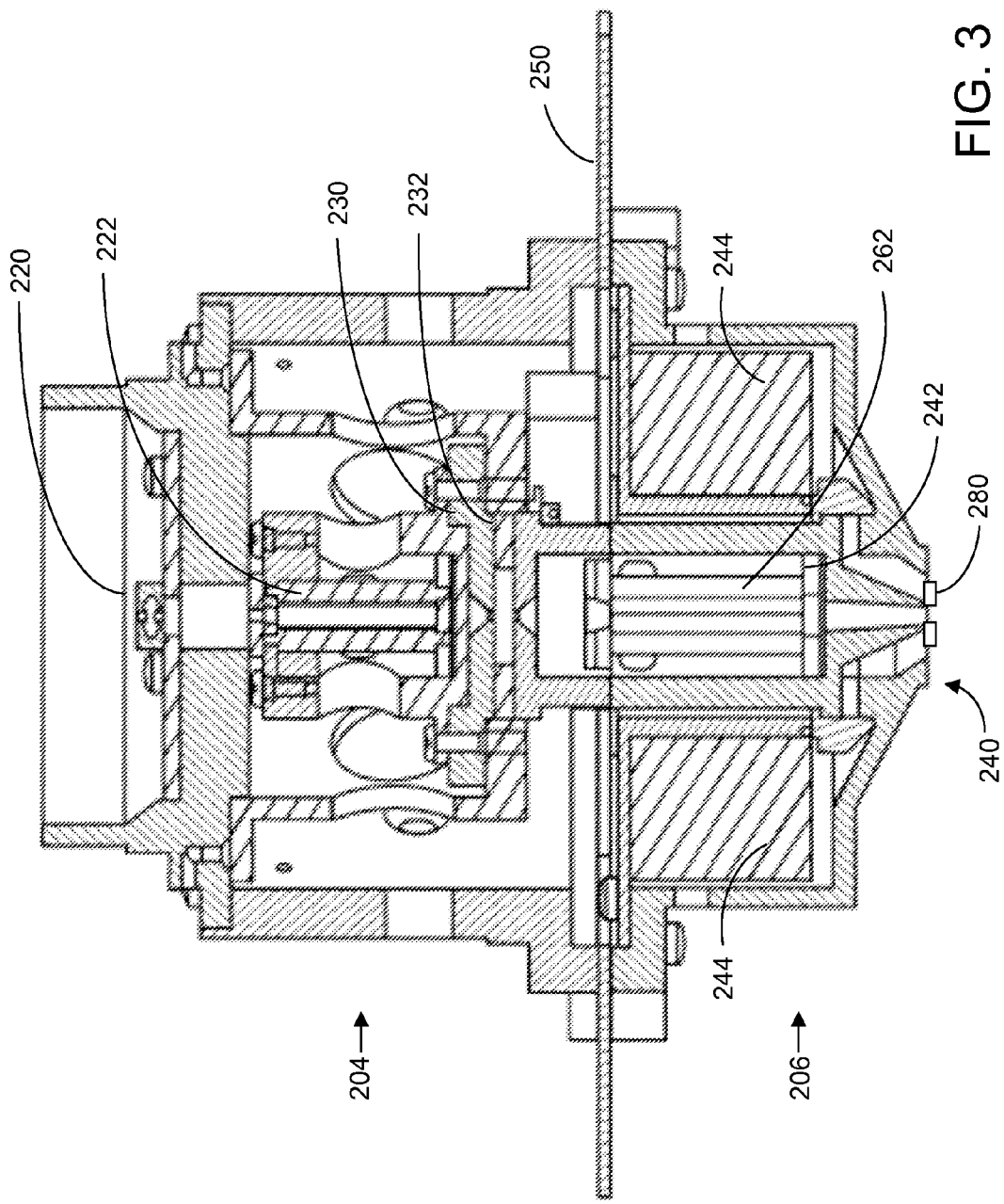
FIG. 3 shows another cross-sectional view of the electron microscope system of FIG.

FIGS. 2 and 3 show several of the subsystems of SEM assembly 102. Such subsystems include an electron source assembly 202, a condenser lens section 204 and an objective lens section 206.

Electron Source Assembly

FIG. 2 shows electron source assembly 202, which includes an electron gun 212 comprising a thermionic emission source 214, such as a lanthanum hexaboride or cerium hexaboride crystal, partly surrounded by a Wehnelt cap 216. Both the thermionic emission source 214 and the Wehnelt cap 216 are maintained at a relatively high negative voltage, typically around −5,000 V, with the Wehnelt cap 216 biased a few hundred volts negative with respect to the source. The Wehnelt 206 cap condenses the electron beam and passes it through its aperture 218 toward an anode 220 that is typically maintained at ground potential.

Alignment Rods

Electrostatic alignment rods 222 align the beam from the source assembly 202 with the optical axis of the lens system to compensate for any mechanical misalignment between the source 214, Wehnelt aperture 218, and anode 220. The alignment rods 222 can tilt the beam axis to provide precise alignment, thereby reducing the required tolerance on the mechanical alignment of the system components and reducing manufacturing costs. Magnetic alignment rods or plates could also be used. In some embodiments, two sets of rods are used to allow the beam to be both shifted and tilted. Using a single set of rods can reduce the cost and complexity of some embodiments.

Condenser Lens Section

SEM assembly 102 includes a condenser lens 230 that uses a magnetic field from a permanent magnet 232 to condense the electron beam. A second permanent magnet 234 provides a magnetic field for the objective lens. A magnetic circuit constrains the magnetic flux from the permanent magnets so that it can be used in both the objective lens and the condenser lens. Condenser lens pole pieces provide the magnetic flux in the electron beam path to condense the electron beam.

Objective Lens Section

SEM assembly 102 uses a permanent magnetic objective lens 240 instead of an electromagnetic lens as used in most SEMs. As describe above, the permanent magnets 232 and 234 provide the magnetic flux to objective lens pole pieces 242. A focusing coil 244 provides additional magnetic flux through the pole pieces 242 to alter the magnetic field to which the electron beam is subjected. The focusing coil 244 is used to change the focal plane of the system, for example, when changing to a different type of sample holder 112, and to provide for fine adjustment to bring the sample into focus.

In a preferred embodiment, the permanent magnets 232 and 234 provide sufficient flux to focus the beam at the system's shortest focal length. The magnetic field from the focusing coil is oriented opposite to the field from the permanent magnets, thereby reducing the flux from the pole pieces and making the beam focus at a greater distance.

Electric Feedthrough

In any electron microscope, it is necessary to apply voltages within the vacuum system, and several means have been employed in the prior art to transfer power and signals from outside the vacuum chamber to inside the vacuum chamber. SEM assembly 102 uses a circuit board 250 sandwiched between the condenser lens section 204 and the objective lens section 206 to provide power and electrical signals from outside the vacuum chamber to elements within the vacuum chamber. The circuit board 250 may be a rigid or flexible board. The electric feed though is described in PCT/US2006/041976 for "Hermetically Sealed Housing with Electrical Feed-In," which is hereby incorporated by reference.

Deflector/Stigmator Rods

Electron microscope system 100 uses a single stage deflector 260 positioned before the objective lens 240. By positioning the deflector 260 before the objective lens 240, the working distance, that is, the distance between the final lens and the sample is reduced, thereby improving resolution. The beam is deflected using deflector rods 262 that are attached to feed-through circuit board 250. Eight deflector rods 262 comprise an electrostatic octupole deflector. The deflector rods 262 are preferably 3 mm to 4 mm in diameter and about 2 cm to 3 cm in length. The rods are soldered to edge connectors on the printed circuit board. Electron microscope system 100 preferably uses analog rather than digital deflection electronics that are located on a second circuit board (not shown) that plugs into the feed-through circuit board 250. Feed-through circuit board 250 uses gold plating as a ground plane to provide electrical isolation. The deflection electronics transfer the deflection signal to the circuit board by a connector. By using eight rods, that is, an octupole design, the deflector 260 also functions as a stigmator to correct astigmatism of the beam. Adjustment of the focus and stigmator may be performed manually or can be automated.

Detector

A preferred system uses a backscattered electron detector 280, which is an annular diode detector that is coaxial with the primary electron beam and which includes a hole through which the primary electron beam passes. A preferred detector 280 is divided into quadrants, and a user can turn on or off individual quadrants or specify combinations, such as additions or subtractions, of the signals from the different quadrants. Such manipulations can alter the image contrast to make the imaging more sensitive to difference aspects of the sample, such as topography or composition. Diode backscatter detectors are more suitable for operating in the higher pressures of SEM assembly 102 than a typical scintillator-photomultiplier secondary electron detector. Because of the relatively high pressure at the sample, some embodiments could us a gas amplification detector, such as those used in environmental scanning electron microscope.

Sample Load/Unload System

A preferred embodiment of the present invention does not include a conventional sample vacuum chamber as was used in the prior art. In most prior art systems, a sample stage is positioned in a sample vacuum chamber below the objective lens. The sample is inserted into the vacuum chamber, either through an air lock or by venting the chamber. The sample chamber is then evacuated to an acceptable level of vacuum for imaging. When imaging is complete, the sample is removed from the sample stage and taken out of the vacuum chamber. The sample stage remains in the system vacuum chamber.

Electron microscope system 100 does not include a conventional sample chamber at all. As discussed in greater detail below, the walls of the removable sample container form part of the walls of a vacuum region containing the sample.

Figure 4:
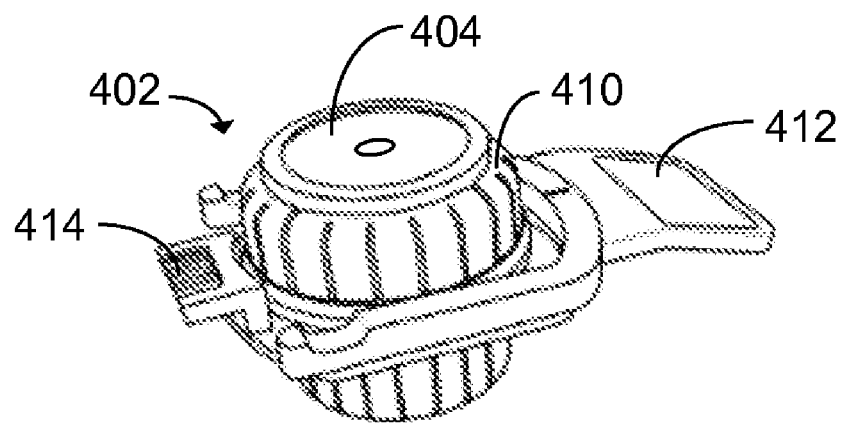
FIG. 4 shows a first sample container used with the electron microscope system of FIG. 1.
Figure 5:
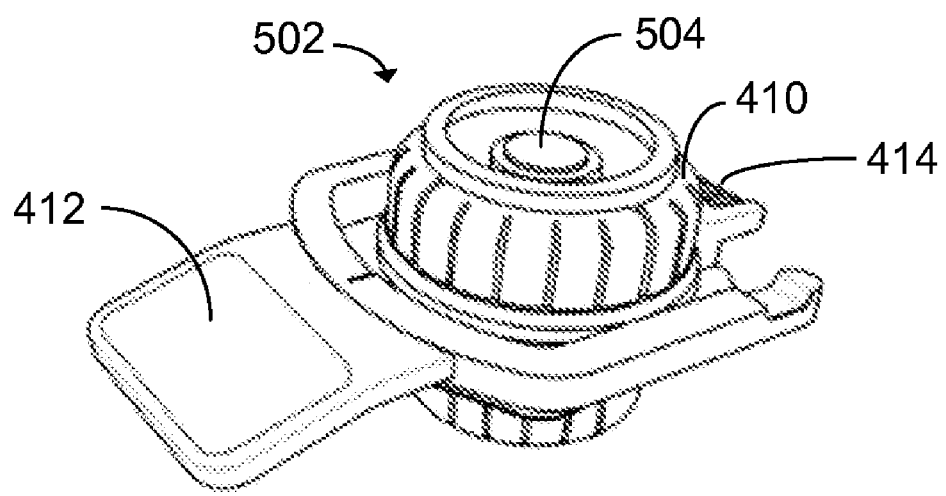
FIG. 5 shows a second sample container used with the electron microscope system of FIG. 1.

FIGS. 4 and 5 show sample holders or sample containers 402 and 502, respectively, which are embodiments of sample holder 112 of FIG. 1. Sample holder 402 includes a conventional metallurgical mount 404 for holding a relatively flat sample, whereas sample holder 502 includes a conventional stub mount 504 that is more convenient for holding a three-dimensional sample. A knob 410 turns a large pitch worm screw mechanism (not shown) that raises or lowers the mount 404 or 504. The worm screw has square threads, and a pin engaged in the threads attached to the sample mount moves the sample mount up and down as the threads turn. A handle 412 is provided for holding the container. Electrical contacts 414 provide a path for electrical signals and power to enter the sample container. The electrical signals can be used, in some embodiments, to control and power, for example, a sample heating coil or cooler, such as a Peltier cooler. Electrical signals can also be used in some embodiments to control a motor or other device to raise and lower the sample or to change the position of the sample. Connections can be made to the container from the system by spring loaded electrical contacts that contact the connectors on the sample container when it is loaded. In some embodiments, a sample holder can include a memory and microprocessor for storing and executing a program to carry out a specified function. For example, a cup may be programmed to heat or cool the sample. By including "intelligence" in the cup, the microscope does not need to be reprogrammed for different types of samples; the programming can be stored in the sample holder. The invention is not limited to any particular type of sample holder.

Navigation Camera

Figure 6A:
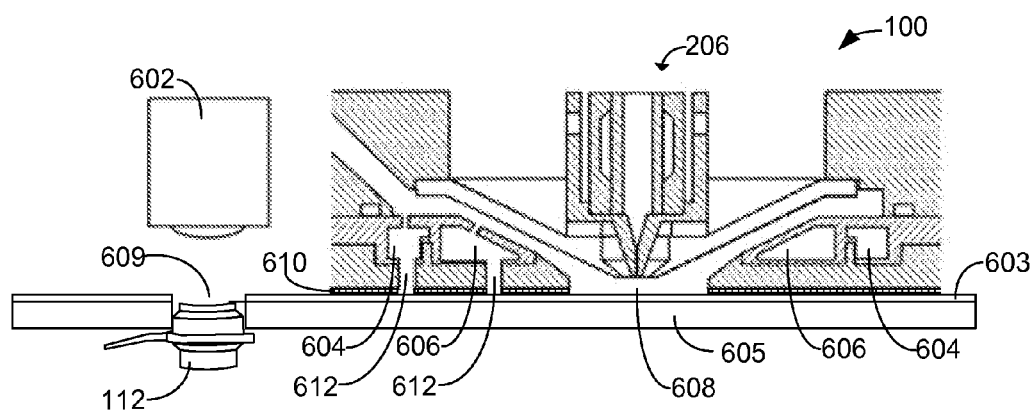
FIG. 6A shows schematically the layout of the lower portion of the electron microscope system of FIG. 1 with the sample holder positioned under an optical navigation camera.
Figure 6B:
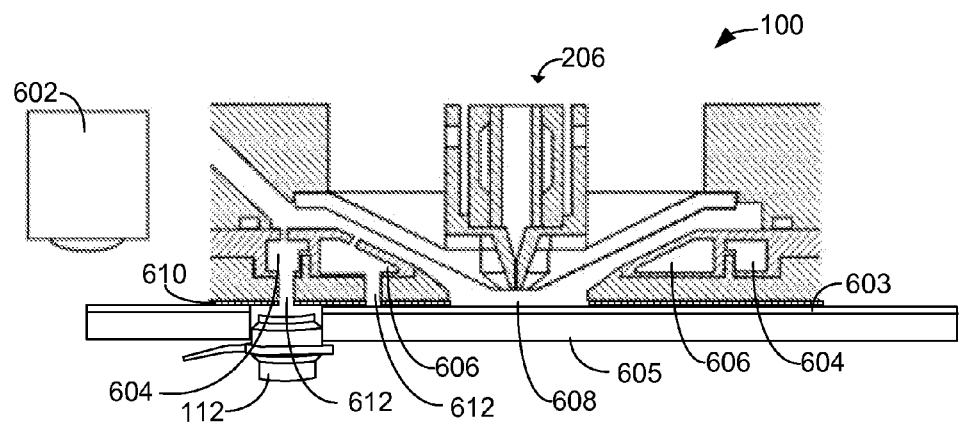
FIG. 6B shows schematically the layout of the lower portion of the electron microscope system of FIG. 6A with the sample holder positioned under a pre-evacuated vacuum chamber.
Figure 6C:
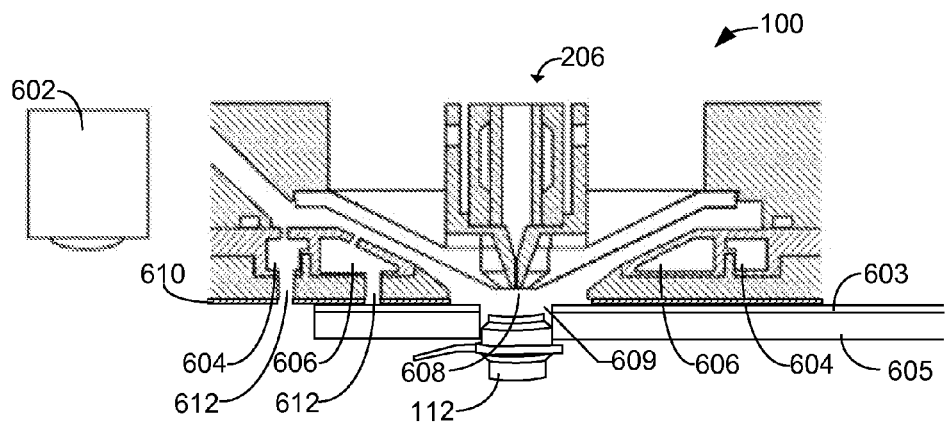
FIG. 6C shows schematically the layout of the lower portion of the electron microscope system of FIG. 6A with the sample holder positioned under a scanning electron microscope.

FIGS. 6A-6C shows a configuration of electron microscope system 100 including an optical imaging device, such as optical camera 602, and the lower portions of electron microscope 100. Optical imaging camera 602 preferably employs a charge-coupled device (CCD) and is preferably positioned such that the sample is observed before its environment is evacuated. The sample container 112 moves under the optical camera, which forms and stores a magnified digital image of the sample. The magnification of the image in optical camera 602 is typically from 10× up to 100×. The optical camera 602 can move up and down to focus on the sample. Movement is preferably by an electric motor, or could be manually. The camera has a field of view of about 8 mm by 8 mm. Multiple images from the camera can be tiled or stitched together to create an image of a larger portion of the sample. The tiling or stitching process can be performed automatically, with the sample being automatically moved under the camera by way of an electric motor into different positions in a serpentine pattern, each position covering a portion of the sample. In each position the image is captured, and all of the images are combined to produce an optical overview of the entire sample. Alternatively, a user can control the movement of the sample to produce only useful images. In manual mode, the user can move the sample under the camera by touching navigation arrows on the touch screen or by pressing a point on the image can re-center the image so that the point touched is in the center of the field of view. Adjacent images displayed on the monitor can optionally be adjusted to provide continuity from image to image caused by distortion or positioning inaccuracies.

In some embodiments, the system can automatically determine the height of the sample within the sample holder 112 based upon the focus of the optical camera and then adjust the focus of the electron beam accordingly. The optical camera 602 has a known focal length, so when the sample is in focus, the distance between the sample and the camera can be determined. This distance is used to determine the sample height for adjusting the SEM focus. The height setting of the sample holder 112 may be automatically communicated to a system controller, which can automatically adjust SEM. The SEM is then automatically adjusted over a continuous range for any working distance or magnification. Settings for the actual sample position are determined by interpolating between settings for a high sample position and a low sample position. The focus can be "fine tuned," either automatically or manually, after being roughly set based on the sample mount height within the sample holder. Another embodiment uses two pre-set height adjustments in the sample holder; one for a wide field of view and one for a narrow field of view. Adjustment for the working distance of the objective lens is made depending on which of the two pre-set working distances are chosen.

Sliding Vacuum Seal

Electron microscope system 100 uses a sliding vacuum seal to move the sample container into contact with vacuum buffers that remove air from the sample container on its way to a position under objective lens 242.

FIGS. 6A-6C shows aspects of the sliding vacuum seal. An operator loads a sample into a sample container 112 outside of the SEM assembly 102, and sample container 112 is then inserted into electron microscope system 100. In one embodiment, a user slides a cover 110 to expose a receptacle for receiving sample container 112. Closing the cover 110 automatically moves before sample container 112 into system 100 and under an optical imaging system, such as optical camera 602, to acquire a low magnification image. Upon closing the cover 110, sample container 112 is moved automatically into a position relative against a rigid sliding plate 605 and sample container 112 makes an airtight seal with rigid sliding plate 605, which in turn makes a sliding vacuum seal with other portions of SEM assembly 102 as described in more detail below.

Figure 7:
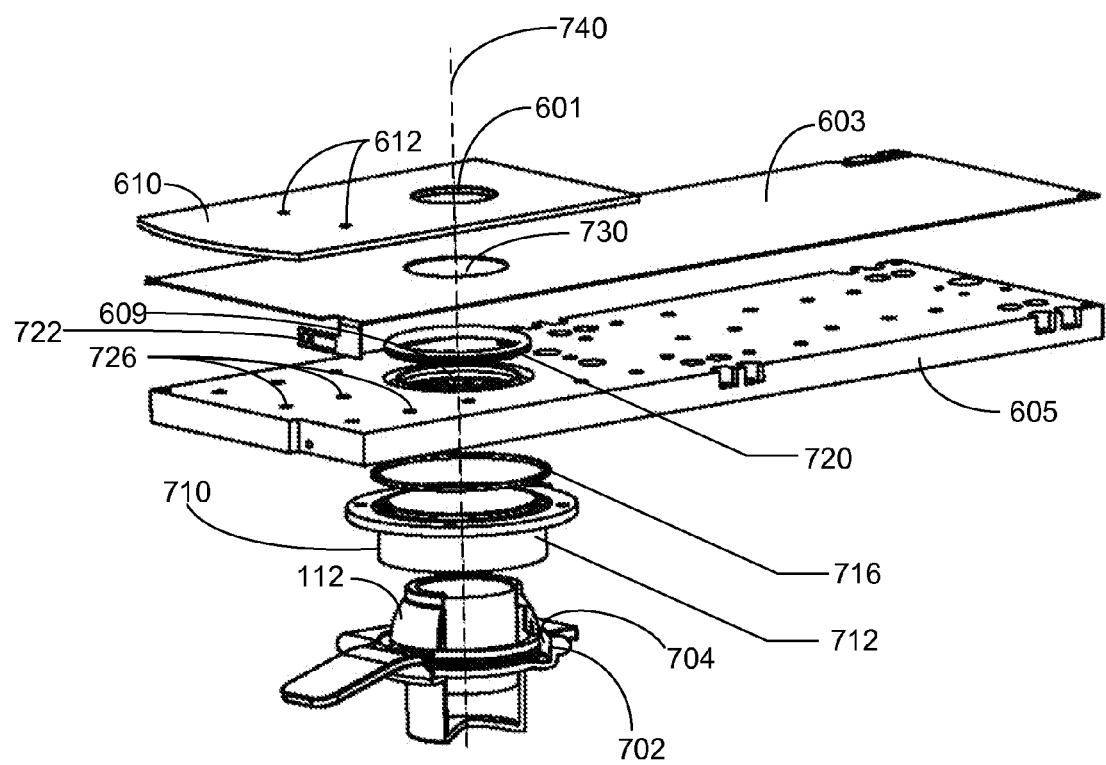
FIG. 7 shows an embodiment of a sliding vacuum seal used in the electron microscope system of FIG. 1.

As shown in FIG. 6A, sample holder 42 is held in a position against a through-hole 46 in a sliding plate 605 to make an airtight seal between the sample holder 42 and sliding plate 605. Sliding plate 605 slides relative to a glacier layer 610 on the base of SEM assembly 102 to move the sample container 112 from optical camera 602 to the sample imaging position of SEM assembly 102. A flexible plate 603 aids in making a consistent vacuum seal with relatively uniform sliding friction. The sliding vacuum seal is described in more detail below with respect to FIG. 7. Sliding plate 605 also moves to adjust the sample position during viewing under the optical camera and the electron microscope. FIG. 7, which is explained in more detail below, shows the configuration of the sample container 112 in the rigid sliding plate 605.

After a low magnification optical image of the sample is obtained from optical camera 602, sample container 112 moves toward the electron imaging position under objective lens 242. FIG. 6B shows that sample container 112 is partly evacuated by passing under pre-evacuated vacuum buffers 604 and 606, which remove much of the air in the sample container 112 as it moves past the buffers. While two vacuum buffers are shown, different embodiments may have more or fewer vacuum buffers.

Vacuum buffers 604 and 606 provide a sufficient vacuum in sample container 112 so that it is possible to acquire an electron beam image in very little time, preferably less than two minutes, less than one minute, less than 30 seconds or less than 15 seconds after the sample container is positioned under the electron beam. Vacuum buffers 604 and 606 comprises a volume, approximately one liter, that is connected to the inlet of turbo pump 282 and that is typically evacuated before the sample is inserted. As the sample container passes the evacuation hole, air leaves the sample container and moves into the vacuum buffer, thereby partly evacuating the sample container. The pressure is reduced in the sample container roughly in proportion to the ratios of the volume in the sample container and the volume in the vacuum buffer. Because the volumes of the pre-evacuation chambers are significantly greater than the volume of the sample container, the pressure is greatly reduced in the sample container, thereby greatly reducing the time required to pump the sample container down to its final pressure for forming an electron beam image.

When the sample container 112 is positioned below objection lens 242 for imaging, the walls of the removable sample container form part of the vacuum chamber walls, that is, the walls of the removable sample container define part of the vacuum volume below the objective lens 242. The volume between the objective lens and the base plate is very small, thereby greatly reducing the time required for extraction before imaging can begin. In a preferred embodiment, the sample container is sufficiently evacuated by the vacuum buffers to begin imaging immediately after the sample container is positioned under the objective lens.

FIG. 7 shows the positional relationship among the components of the sliding vacuum seal. A flexible seal 702 within a groove 704 around sample container 112 seals with the interior of cylindrical portion 710 of a flanged cylinder 712 which is attached to rigid sliding plate 605 and sealed by an o-ring 716 against rigid sliding plate 605. Flexible stainless steel plate 603 is clipped to sliding plate 605 using clip 722 and moves with sliding plate 605. To move sample container 112 into position under the under the axis 740 of electron column objective lens 246, the sliding plate 605 slides along glacier layer 610 attached to a base plate 611 of the SEM assembly 102. Springs (not shown) can be inserted into blind holes 726 in the rigid sliding plate 605 to press the flexible sheet 603 against the glacier layer 610 to ensure a better vacuum seal around holes in the glacier layer, such as the holes 612 that connect the sample container 112 with vacuum buffers 604 and 606 and the holes through which the electron beam passes (glacier plate through-hole 601, sliding plate through-hole 609, and flexible plate through-hole 730). A flexible seal 720 seals flexible plate 603 relative to rigid sliding plate 605. Using a flexible plate between the rigid plate and the microscope base reduces the sliding frictional force needed to slide the rigid plate and makes the sliding force more consistent. Using glacier layer 610 on the bottom of plate 611 reduces friction and reduces the generation of particles.

Figure 8:
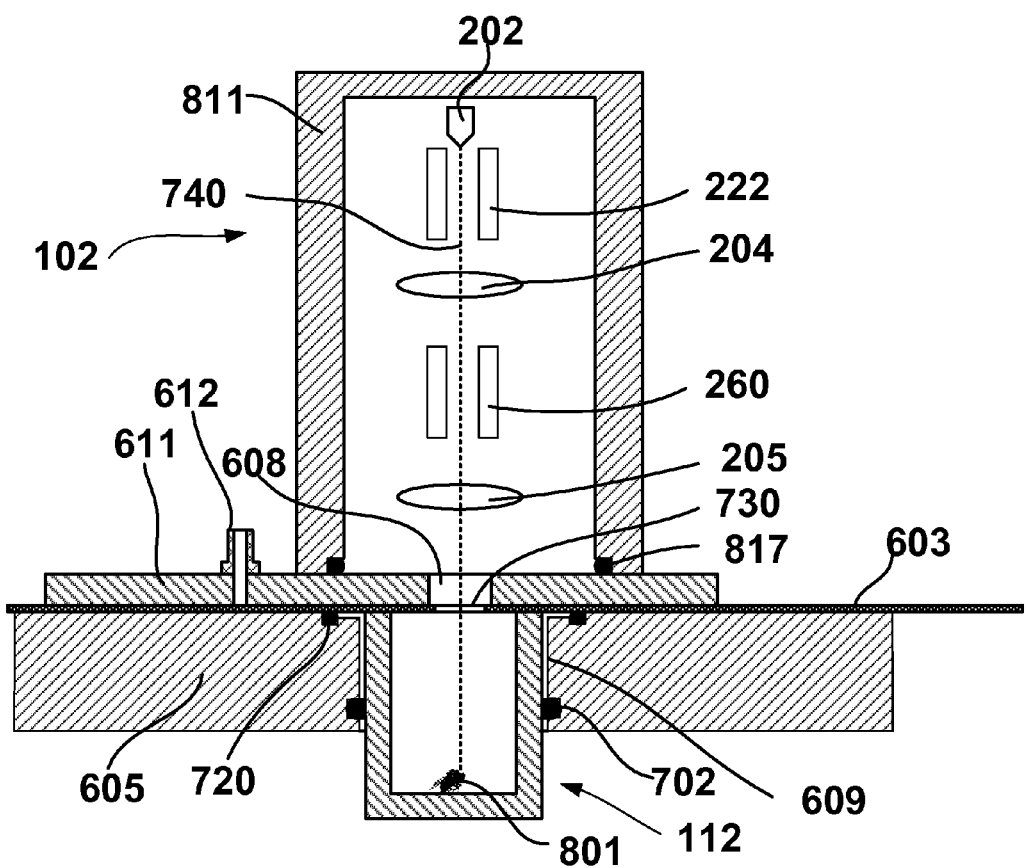
FIG. 8 shows a schematic diagram of the sliding vacuum seal of the electron microscope system of FIG. 1.

The edges of the holes in rigid sliding plate 605 are contoured to reduce frictions, as described in a PCT/US2007/010006 to Persoon et al., filed Apr. 27, 2007, for "Slider Bearing for use with an Apparatus Comprising a Vacuum Chamber," which is hereby incorporated by reference. The curvature is preferably such that the Herztian contact pressure between the moving parts will minimize particle generation. FIG. 8 shows a schematic view of the components of an electron microscope having a sliding vacuum seal for moving sample holder 112 containing a sample 801. A seal 817 seals a vacuum housing 811 to plate 611.

Vacuum System

A preferred vacuum system includes two vacuum pumps, external pre-vacuum pump 110 and an integral high vacuum pump such as a turbomolecular pump 282 (FIG. 2). Pre-vacuum pump 110 can be, for example, a diaphragm pump that provides the initial pump down from atmosphere and provides an acceptable exhaust pressure for high vacuum turbomolecular pump 282. The turbomolecular pump is preferably not contained in a separate pump housing; instead, the turbo rotor is integrated into the electron source assembly 202. Different pressures are maintained in three different zones of electron microscope system 100 using the same pumps, with the lowest pressure being maintained at the electron gun, a somewhat higher pressure being maintained between the electron source 202 and the objective lens 242, and a higher pressure yet being maintained at the sample.

A higher pressure is maintained around the sample to prevent charging of the sample. Gas around the sample is ionized by the primary electron beam and by secondary electrons, and the charged particles created by the ionization neutralize charge that accumulated on the sample. The pressure around the sample is preferably sufficient to neutralize charge, while not being so great that the spot size of the primary beam is enlarged to an unsatisfactory extent. Another advantage of the higher air pressure around the sample is because the sliding seal that permits the sample container to be slid under the electron beam does not provide an absolutely airtight seal, and as the sample container is moved under the beam to view different parts of the sample, different amounts of air will leak into the sample cup. By maintaining the pressure around the sample at a relatively high value, fluctuations in the air pressure caused by movement of the sample cup 402 have less effect on imaging because the pressure changes are a smaller percentage of the pressure.

Pressure at the sample is preferably maintained automatically as described in U.S. Provisional Pat. App. No. 60/764,192, filed Feb. 1, 2006 to Slingerland et al. for "Particle optical Apparatus with a Predetermined Final Vacuum Pressure," which is hereby incorporated by reference. U.S. 60/764,192 teaches that a predetermined vacuum pressure can be maintained in a vacuum chamber by connecting the chamber through a known vacuum conductance to a volume at a first known pressure and through a second connection of a known vacuum conductance to a vacuum pump. The pressure in the chamber is determined by the ratio of first and second known conductances, as well as the first known pressure and the pressure at the vacuum pump inlet. As described in U.S. 60/764,192, by adjusting the relative values of the first and second vacuum conductances, a desired pressure can be maintained in the vacuum chamber without requiring a vacuum gauge or a control system.

In electron microscope system 100, the sample volume connects by a first vacuum conductance to the low pressure side of the diaphragm pump, which has a relatively high pressure, and by a second vacuum conductance to the low pressure side of the turbomolecular pump, which has a relatively low pressure.

The final pressure in the sample area will be determined by the ratio of the first and second conductances. The final pressure can be determined by:

$$P_{sam} = (C_2/C_1)/P_{DP}$$

in which $P_{sam}$ is the pressure in the sample volume; $C_2$ is the vacuum conductance in liters/second from the sample volume to the inlet of the turbomolecular pump; $C_1$ is the conductance in liters/second from the sample volume to the inlet of the diaphragm pump; and $P_{DP}$ is the pressure at the diaphragm pump inlet.

By controlling the pressure at the diaphragm pump inlet, the final pressure of the sample volume can be set to a prescribed value. By admitting gas from the inlet of the diaphragm pump, which has a pressure $P_{DP}$ significantly less than atmospheric pressure, larger apertures can be used compared to those that would be required is the gas were introduced directly from the atmosphere. The pressure in the sample volume is preferably at least five times greater than the pressure at the inlet to the turbomolecular pump. The gas that leaks into the sample chamber from the second vacuum conductance is preferably about five times the leak that occurs from the sliding vacuum seal described below, so that fluctuations in the pressure due to movement of the sliding vacuum seal are relatively small compared to the pressure in the sample area.

The pressure at the inlet to the turbomolecular pump and at the electron gun is preferably about $10^{-7}$ mbar. The pressure in the sample cup is preferably between about 0.1 mbar and 50 mbar, with about 0.2 mbar being preferred. The pressure in the mid-column between the anode and the pole pieces of the objective lens preferably operates at pressure of about $10^{-5}$ mbar. An aperture in the pole pieces of the objective lens 240 functions as a pressure limiting aperture to maintain a pressure differential above and below the lens. The anode 220 or another similar aperture maintains a pressure differential between the electron source and the mid-column. A beam limiting aperture (not shown) can also function as a pressure limiting aperture. Skilled persons can readily apply known technology used in environmental scanning microscopes, together with information provide herein, to produce appropriate pressures in the different portions of the chamber.

User Interface
Main Image Screen

When the sample is imaged at the high magnification of the SEM, it can be difficult for an untrained operator to determine the location on the sample from which the image is being obtained and to understand the relationship between the image and the rest of the sample. As shown in FIGS. 9-13, the preferred main image screen 13 of the graphical portion of the user interface includes three "image windows" that remain on the display to help the user put a magnified image in context. One window, referred to as the active image window 14, shows the current image. Depending upon the current operation being performed, the current image may be an image taken when the sample is under the optical navigation camera 602, an image formed by the SEM when the sample is under the SEM, or an image recalled from a storage medium, as discussed below.

Another image window, referred to as the optical overview window 15, shows an image from the optical navigational camera 602. The image is typically obtained and stored before the sample holder is evacuated and before the sample is moved under the SEM, although the sample could also be moved back from the electron beam to the navigation camera if desired. As described above, the image in the optical overview window 15 may be formed from multiple fields of view of the optical navigational camera juxtaposed to form a single image, or the image can be from a single field of view of the optical navigational camera.

The remaining image window, referred to as the electron beam overview window 16, shows a relatively low magnification electron beam image. The image in the electron beam overview window 16 is preferably obtained at the lowest available magnification for the particular working distance. When the sample is first imaged with the electron beam, the image in the live window and the electron beam overview window will be the same. When the magnification of the active image is increased, the original relatively low magnification image will remain in the electron beam overview window to provide an additional reference for the operator. If the electron beam overview window is then refreshed, the SEM system will drop down to the lowest available magnification, re-image the sample, and then return to the original increased magnification for the active image.

The main viewing screen 13 may include a databar 33 at the lower portion of the main viewing window 13 that shows, for instance, the date, time, magnification and scale of the current image. A data bar 33 may also be included on the electron beam overview window 16. Navigation arrows 29 on the four sides of the active viewing window 14 allow the user to move the image to show different parts of the sample. A user can also touch any portion of the current image to re-center the image on the touched position, or by "clicking and dragging" the image, should a mouse or similar input device be employed, as will be understood by those of ordinary skill in the art. As described above, touch screen 106 enables a user to merely touch the display monitor 104 to activate a desired function. In this case, a user may depress the image being displayed in the optical overview window 15 and drag it to a desired position and, finally, release to set the image in a desired location within the window 14. A stylus may be used to this extent, or a user may simply use a finger.

Various selectable icons 19 (FIG. 9) positioned along the edges of the windows, such as an switch icon 23 (FIG. 10) for acquiring an image either from the optical navigational camera 602 or the scanning electron microscope, an eject icon 26 for loading and unloading the sample holder into the loading bay of the SEM assembly 102, an overview icon 22 for obtaining an optical overview of the entire sample, and various digital picture icons 34 for saving an image to removable media. Many of the icons shown in FIG. 9 include text that portrays the command or feature which the icon selectively represents. However, as shown in FIGS. 5-9, such icons may alternatively make use of an image or graphical representation to indicate their respective functions, such as, for example, a camera icon representing a "save to digital file" function. A selectable icon to load/unload the sample, for example, may be provided by an icon similar to that used on CD players to load/unload the sample holder into the area of the navigational camera or into the area of the SEM. Pressing the eject icon 26 unloads the sample holder from the system, and the other selectable icons operate in similar fashion.

Figure 10:
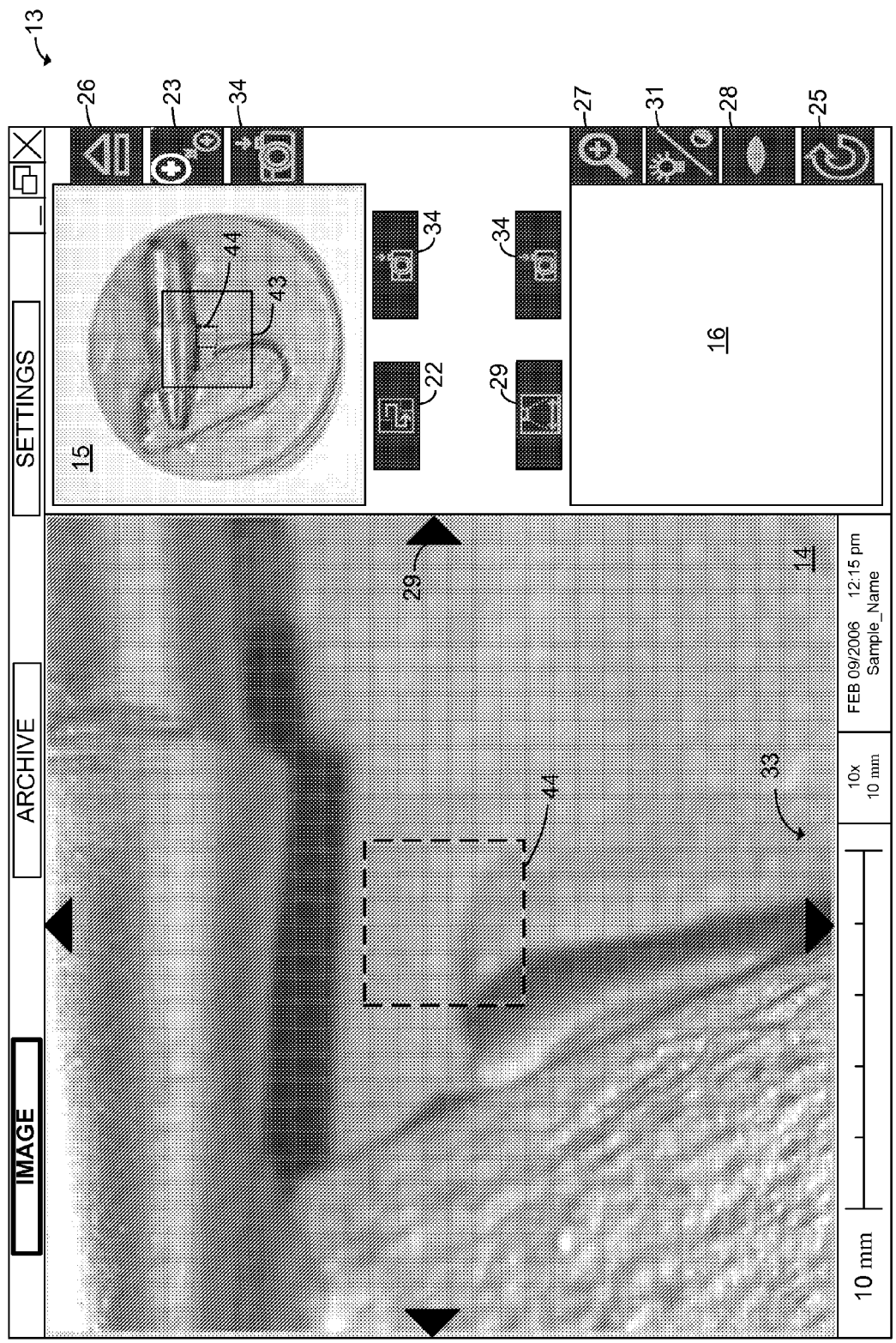
FIG. 10 shows the screenshot of FIG. 9 with an image taken by the optical navigational camera shown in the smaller optical overview window and a magnification of the image shown in the larger main viewing window with a perimeter indicator imposed on the images.

Selectable icons 19 can be used together with a rotary input device 108 or other mechanical input device. For instance, when the user presses the magnification icon 27, for example, rotating the control on the rotary input device 108 will increase or decrease the magnification. Depressing the rotary input device 108 will change the control from coarse magnification to fine magnification control. When the control is "fine," an "F" (not shown) appears on the magnification icon 27 to indicate that the fine control is operating. Toggling from coarse to fine and back can be done by depressing the rotary input device control 108 or by touching the magnification icon 27 on the screen 13. The controls are similar for the contrast/brightness 31, focus 28, and rotation 25 buttons. Regarding the contrast/brightness icon 31, pressing the rotary input device 108 once associates the rotation control on the rotary input device 108 with brightness control, and pressing the rotary input device 108 a second time associates the rotation control with contrast control. Contrast and brightness can also be controlled automatically, if the user has set those functions for automatic control under the settings screen (as shown in FIG. 10) discussed in greater detail below.

The digital picture icons 34 function to store the image displayed in the corresponding window. The image is typically saved to a USB memory stick that plugs into the system.

In one preferred embodiment, the system has no user accessible memory, and all images are saved to a removable medium. In another embodiment, the system is connected to the internet, and images can be saved to a web address or sent via e-mail. The use of removable memory makes the system particularly useful in academic environments, in which students can use the system, save their images, and take their images with them or send them over the internet.

The uses of these different image windows to allow an inexperienced user to easily operate the SEM will now be discussed with reference to FIGS. 5 to 9. In a preferred embodiment, once a sample has been loaded into the SEM, the sample is transferred automatically to the optical imaging position (as shown in FIG. 6A). The optical navigational camera is then activated and, as shown in FIG. 10, an optical image of the sample (a ball point pen tip in this example) is displayed in the optical overview window 15. A more magnified optical image is displayed in the main viewing window 14.

FIG. 10 shows the use of two rectangular perimeter indicators; a large perimeter indicator 43 and a smaller perimeter indicator 44 inside the larger indicator. Perimeter indicator 43 is shown as a solid line, while smaller indicator 44 is shown by a dashed line. Both indicators are superimposed over the optical image to indicate the area of the sample to be imaged. The larger indicator 43 serves to indicate the approximate perimeter of the entire magnified image as seen in the main viewing window 14. The smaller indicator 44 indicates the area of the sample that will be imaged by the electron beam. When using a color display monitor, any perimeter indicators will preferably be of a color that easily stands out as imposed against the image. One of ordinary skill in the art will readily recognize that the perimeter indicators also serves as a reference indicator so that a user may more easily locate which area of the image is in fact in the magnified main viewing window 14 by referencing the perimeter indicator imposed over the image from the optical overview window 15. The perimeter indicators may be take other shapes such as, for example, a cross or circle.

Figure 11:
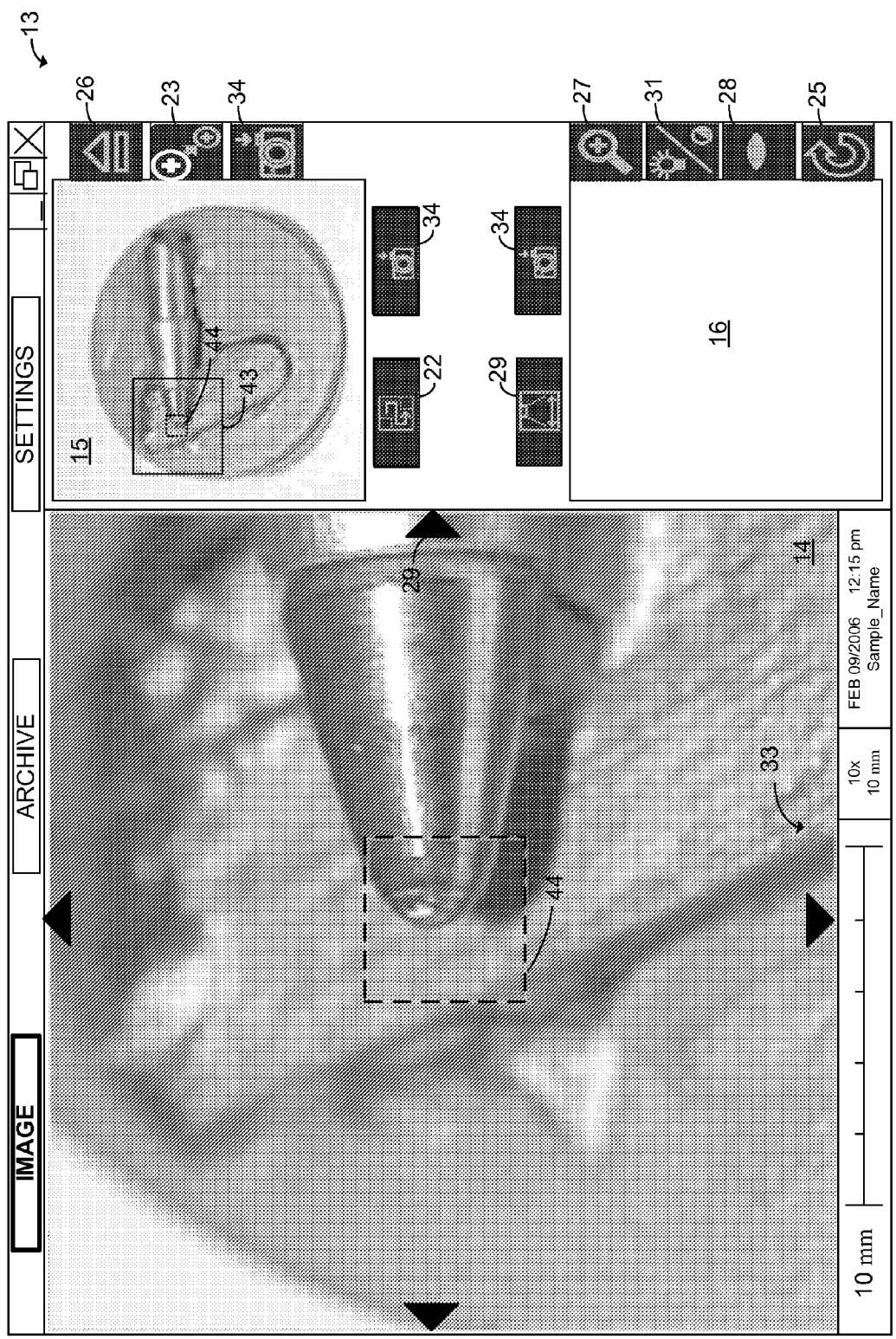
FIG. 11 shows the screenshot of FIG. 10 with the perimeter indicator moved to a different area of the image.

Once the two images have been displayed, the portion of the sample to be examined under the SEM can be moved to the center of the optical field of view. This can be accomplished, for example, by touching a particular point in either image on the touch screen display and allowing the point to be automatically centered or by inputting instructions to move the sample, for example by using directional arrows 29 located either on the screen or by using a keyboard (not shown). FIG. 11 shows the user interface screen after centering the tip of the ball point pen.

After the part of the sample to be viewed has been centered, the sample can be imaged using the SEM. Electron imaging can be selected, for example, by using the "switch" icon 23 as shown in FIG. 11 to switch from optical imaging to electron imaging. Switch button 23 can be indicated, for example, either by text or by an icon showing a large and a smaller shape, each having a cross therein may also be available. In this example, the smaller shape represents the optical camera 602 and the larger shape represents the electron microscope. When the button is pressed, the sample moves between the optical camera position (as shown in FIG. 6A) and the electron microscope position (as shown in FIG. 6B). An arrow on the button can be used to indicate where the sample will go when the button is pressed.

Figure 12:
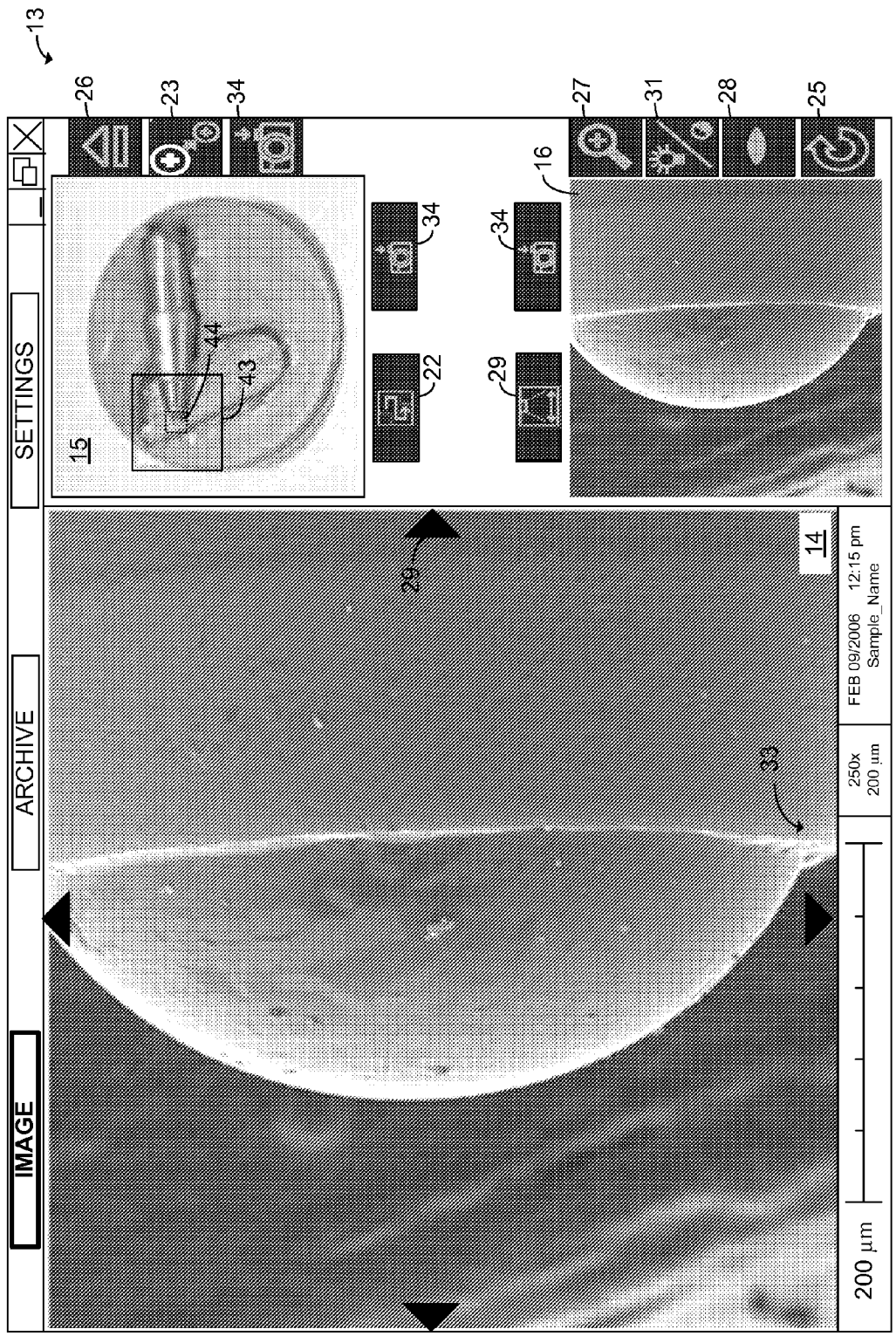
FIG. 12 shows a screenshot with a the same low magnification electron microscope image of the area selected on the optical window of FIG. 11 shown in the large main image window and in the smaller electron beam overview window.

In FIG. 12, the image produced by SEM 93 is shown in both the main viewing window 14 and the electron beam overview window 16. In the example of FIG. 12, the image is initially displayed in the lowest possible magnification. The image shown in the main viewing window 14 can then be magnified as desired, for example by selecting magnification button 27 and then operating a magnification slider on the screen (not shown), turning the rotary input device 108, or directly inputting a desired magnification.

Figure 13:
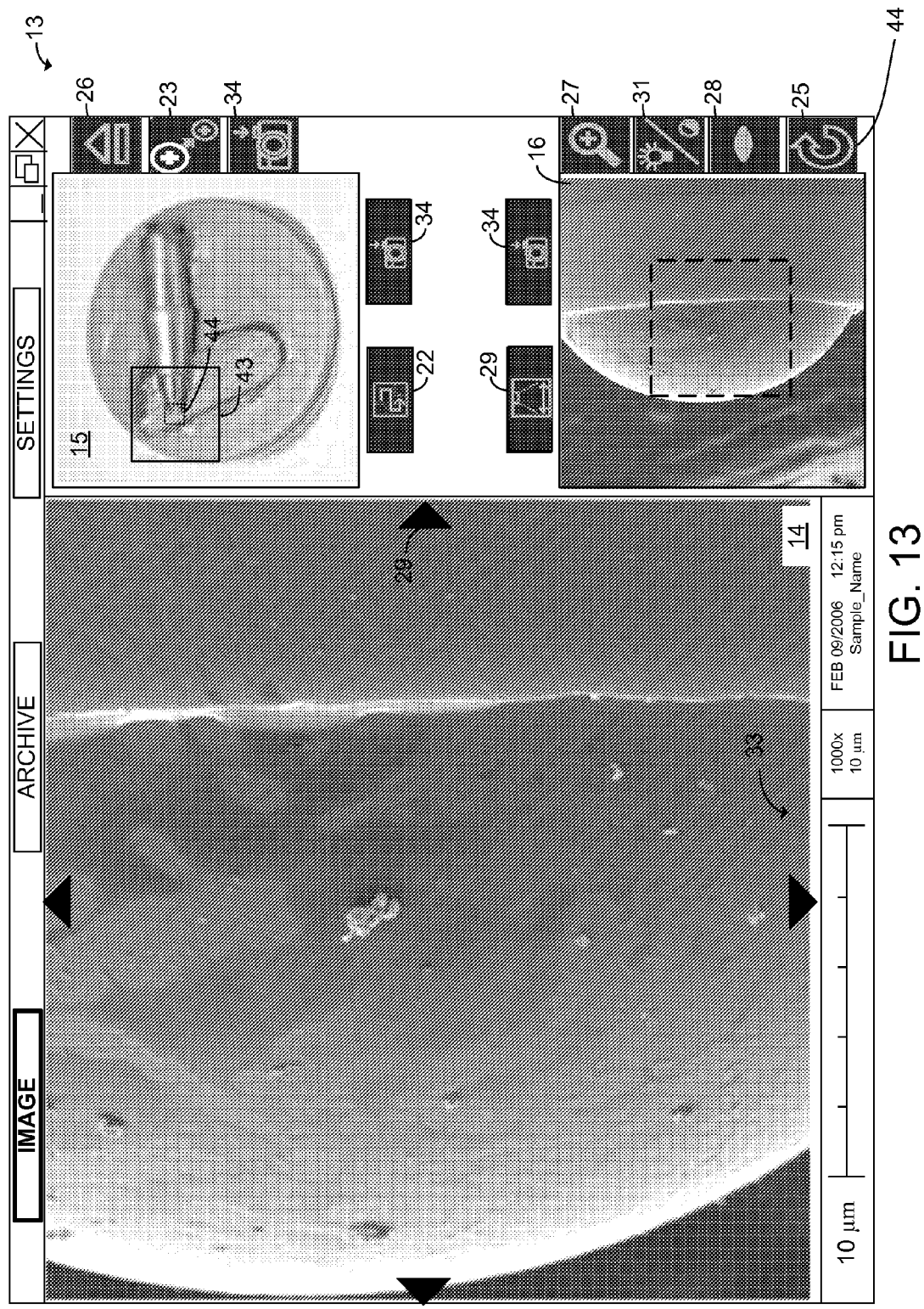
FIG. 13 shows the screen shot of FIG. 12 with the main image screen showing a higher magnification electron microscope image area of the area indicated by the perimeter indicator in the electron beam overview window.
Figure 14:
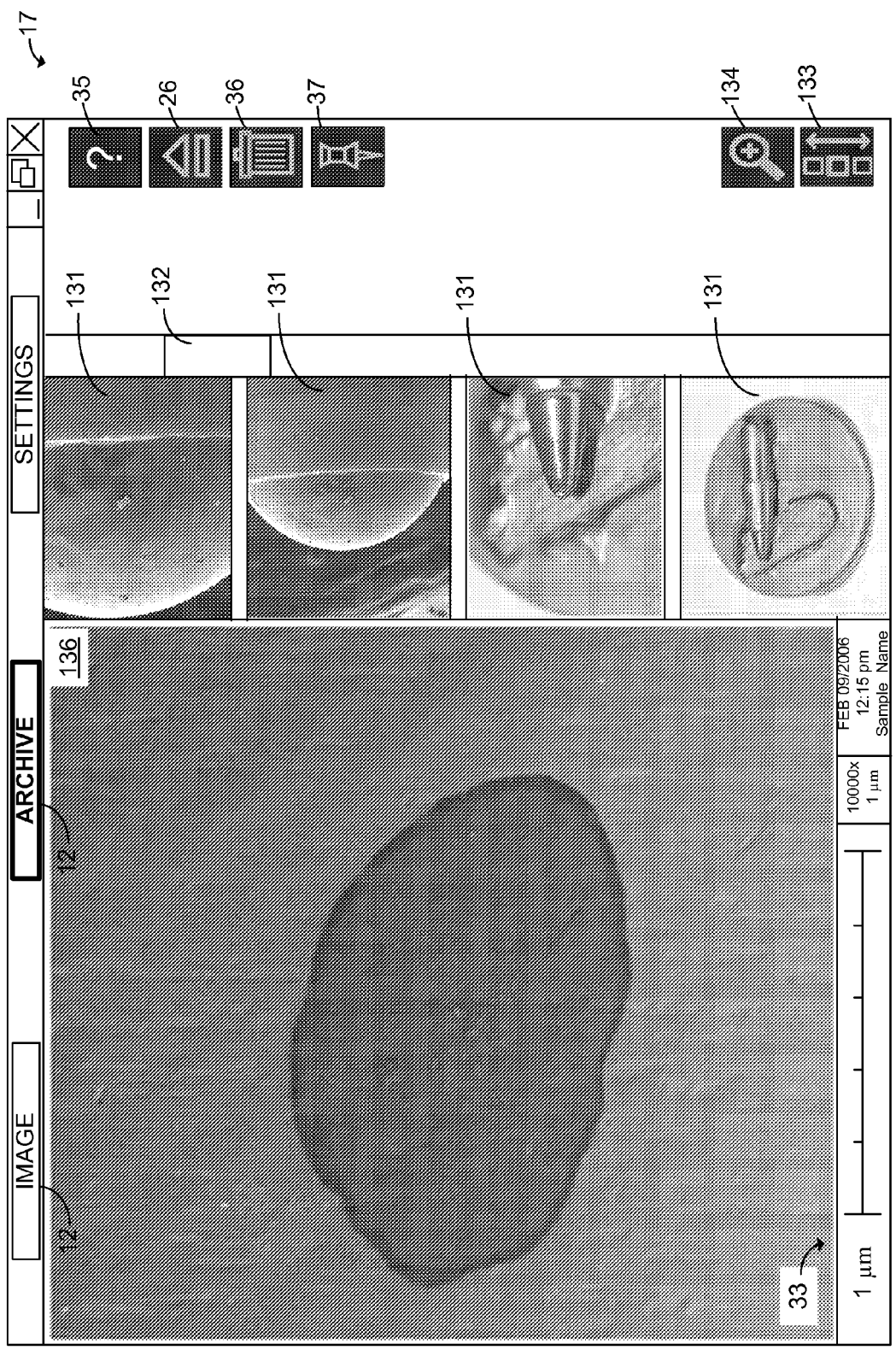
FIG. 14 shows a screenshot of the archive screen of the user interface according to a preferred embodiment of the present invention.
Figure 15:
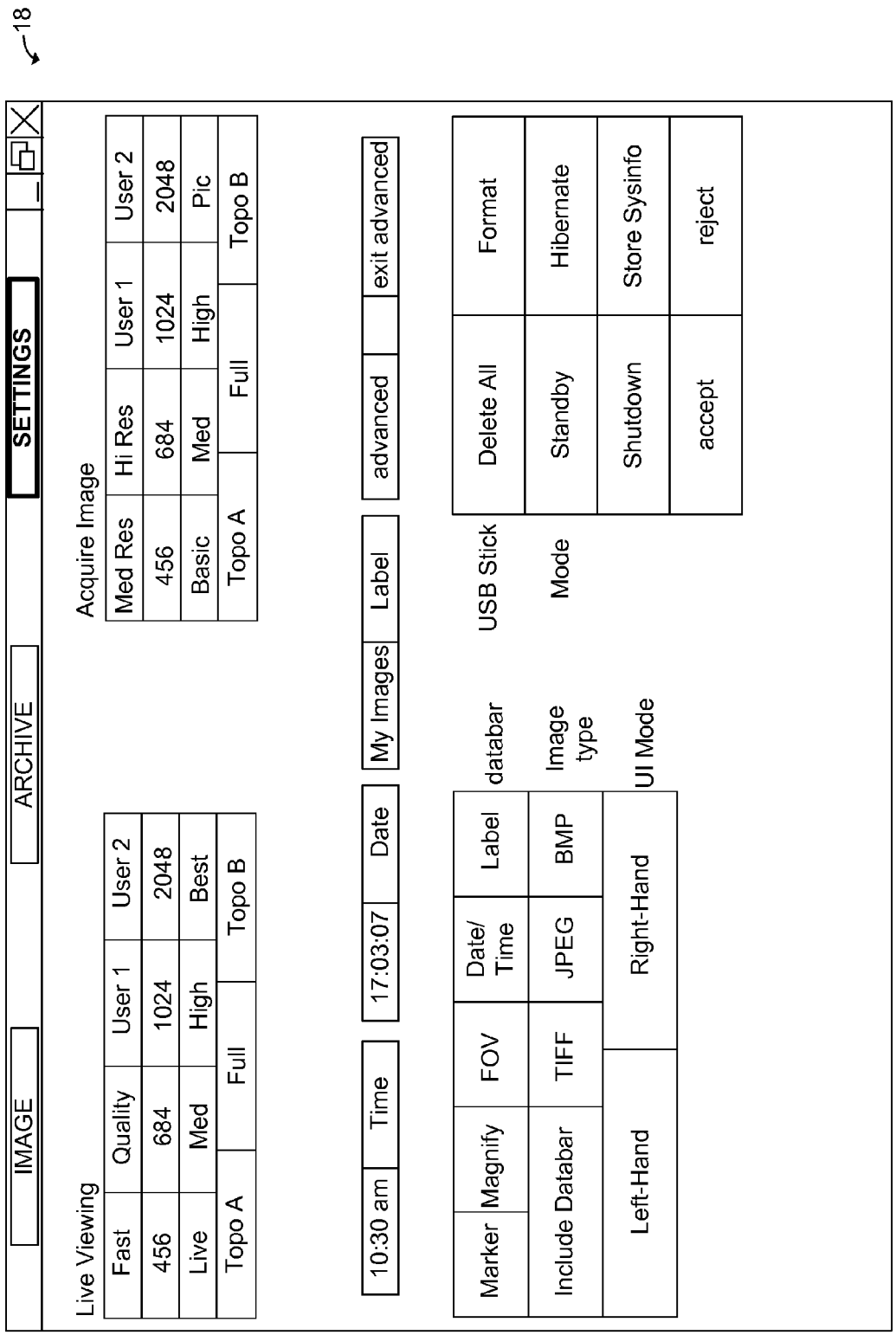
FIG. 15 shows a screenshot of the settings screen of the user interface according to a preferred embodiment of the present invention.

The magnified image will then be shown in main viewing window 14 as shown in FIG. 13. The image in the optical overview window 15 typically remains unchanged after the sample leaves the optical camera and moves under the SEM. The image in the electron beam overview window 16 is typically at a magnification that is too large to show the entire sample. When the sample is moved under the SEM, the main viewing window 14 may show a portion of the sample that is outside the image in the electron beam overview window 16. In that case, the image in the electron beam overview window 16 can be automatically or manually changed to show an overview of a portion of the sample that is a superset of the portion shown in the main viewing window 14. For example, if the user presses a refresh icon 29 on the main screen 14 near the electron beam overview window 16, a new low magnification electron beam image will be obtained that is centered on the same spot as the main viewing window 14. A new image may be acquired, for example, if the image in the main viewing window 14 has been moved so that the image in the main viewing window 14 corresponds to a point on the sample outside the image in the electron beam overview window 16. The low magnification image may be obtained by increasing the beam deflection. The low magnification image may have, for example, a 400 µm field of view, and if the sample is moved one millimeter, it would be necessary to obtain another low magnification image.

As described above, a perimeter indicator, such as a colored rectangle or cross, on the optical overview window 15 shows the location of the image in the electron beam overview window 16. Similarly, a perimeter indicator 45 on the electron beam overview window image indicates the position and preferably the relative size of the image in the main viewing window 14 on the electron beam overview window image. For example, as the magnification of the main viewing window 14 is increased, the perimeter indicator on the electron beam overview window 16 will get smaller to correspond to the smaller area that is shown in the higher magnification image in the main viewing window 14.

With the perimeter indicators as described above, a user can readily determine at high magnification where on the sample he or she is viewing in the main viewing window 14, thereby providing a context to even a user that is not familiar with high magnification images.

In addition to the main image screen, the preferred embodiment of a user interface shown in FIGS. 4-9 also includes tabs 12 enabling a user to access the other two screens: the archive screen 17 and the settings screen 18 (or to return to the main image screen from either of the two additional screens.

Archive Screen

Figure 9:
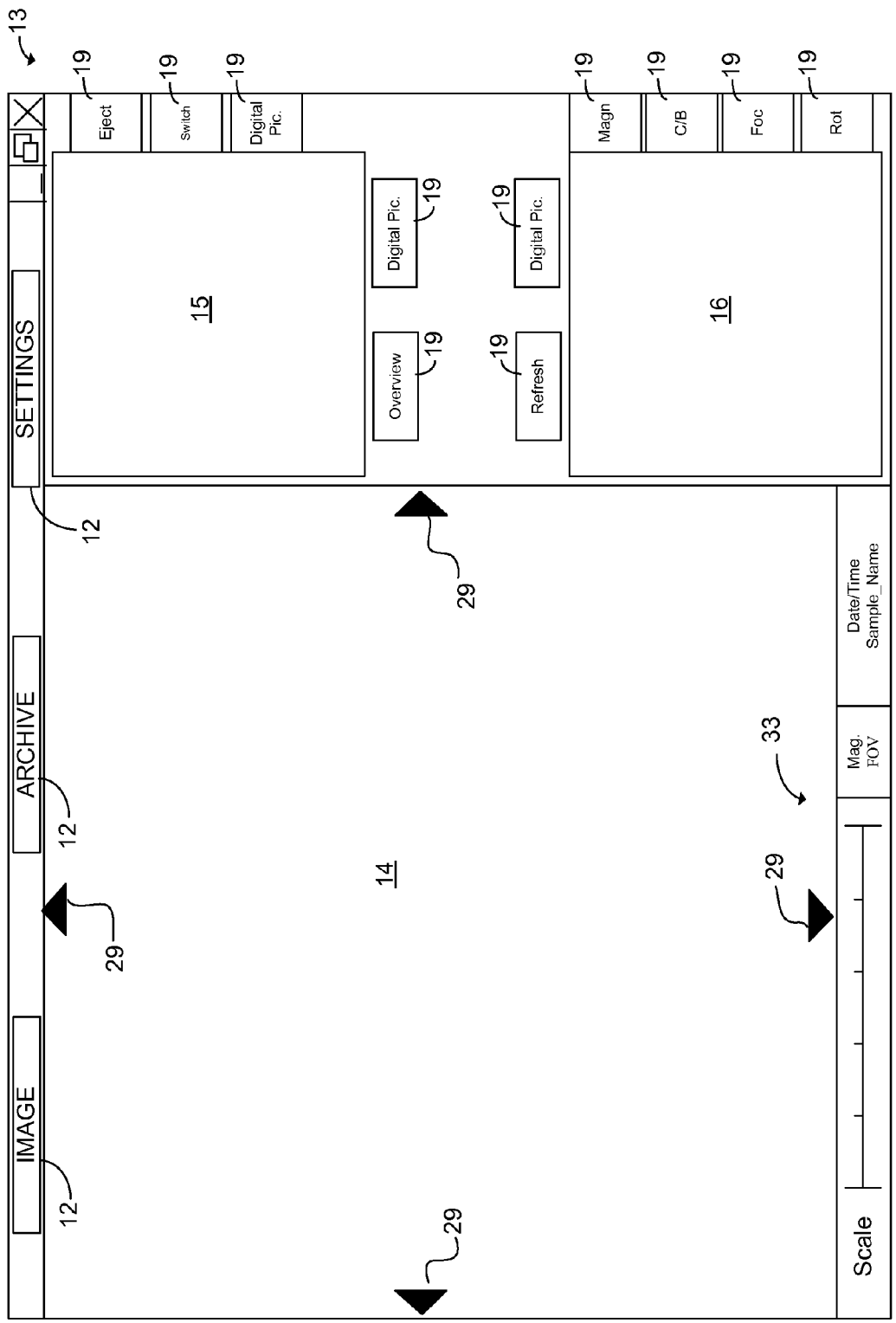
FIG. 9 shows a screenshot of the graphical portion of the user interface according to a preferred embodiment of the present invention, depicting three image windows and various selectable buttons of the main screen.

As shown in FIG. 9, the archive screen 17 lets the user browse and operate on images stored on the removable memory media. The archive screen 17 is similar to the main screen 13 and includes an active image window 136 and a thumbnail gallery 131 of saved images for comparing and manipulation. A databar 33 may be included on the archive screen 17, in similar fashion as used in the main screen 13. The controls, or selectable icons 19, are similar to those of a digital camera memory and include icons for accessing a help file 35, ejecting a sample 26, deleting an image 36, holding an image to compare a selected image with other images 37, zooming 134, and browsing 133 through the image gallery. A scroll bar 132 is also included for scrolling through the thumbnail gallery 131. The user can perform other image manipulation that would be available on a digital camera or photo editing software.

Settings Screen

As shown in FIG. 10, the settings screen provides certain user settable functions. For example, the user can select which detector configuration to be used to form the electron beam images. A "fast" scan setting allows fast image refresh times, but provides images of lower resolution. A "quality" scan setting allows slower image refresh times and high quality resolution. Through the settings screen, a user can select viewing a live image in "fast" mode while saving the image in "quality" mode, and delete and format the USB memory stick, or other removable storage medium. Date and time can be set and labels created for images. A user can select which format to save the image file, whether it is a TIFF, JPEG or BMP format. The user can also set whether to automatically adjust brightness and contrast, and how often to make the adjustments. For example, brightness and contrast might be adjusted whenever the image is moved, or periodically. The stigmation is adjusted once in the user settings, and then is typically stable, not requiring additional adjustment. At least one user profile selection can be selected to store the settings of particular users for faster processing and operation times.

To maintain a simple user interface, the beam energy and current is typically preset at the factory and not adjustable by the user. During assembly, standard set up functions are performed, such as mechanically aligning to center the Wehnelt cap and filament over the anode.

In a preferred embodiment, more advanced options for controlling and optimizing the SEM system are available but protected by a password to prevent access by less experienced operators. For example, source tilt can be adjusted to optimize electron beam illumination intensity; a stigmation control allows adjustment of the sharpness of the electron image contours; and stage position and rotation can be calibrated stage to insure that the part of the sample being viewed is the same in both optical and electron imaging mode.

While the sample holder and associated method are described with respect to a scanning electron microscope, the concept is applicable to any vacuum tool or instrument, such as a focused ion beam system.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A scanning electron microscope, comprising:
a source of primary electrons for an electron beam;
a lens for focusing the electron beam;
a detector for detecting electrons from the sample;
a removable sample holder for holding a sample for observation with the electron microscope, the walls of the sample holder forming part of the walls of a vacuum region containing the sample, thereby substantially reducing the time required to evacuate the beam path to provide a vacuum adequate to form an electron microscope image of the sample.

2. The scanning electron microscope of claim 1 further comprising vacuum buffer volumes that evacuate the sample container before it is positioned under the lens.

3. The scanning electron microscope of claim 1 in which the removable sample holder includes electrical contacts for providing power or data to the sample holder.

4. The scanning electron microscope of claim 3 in which the removable sample holder includes a microprocessor for controller a sample holder function.

5. The scanning electron microscope of claim 3 in which the removable sample holder includes a heater or a cooler.

6. The scanning electron microscope of claim 1 in which the sample is maintained at a pressure of greater than 0.1 mbar.

7. The scanning electron microscope of claim 1 in which the removable sample holder includes an adjustable height mount for adjusting the vertical position of the sample within the sample holder.

* * * * *